(12) United States Patent
Dungan (10) Patent No.: US 12,199,007 B2
(45) Date of Patent: Jan. 14, 2025

(54) COPPER CONNECTED GLASS MODULES ON A GLASS BOARD

(71) Applicant: Broadcom International Pte. Ltd., Singapore (SG)

(72) Inventor: Thomas Edward Dungan, Fort Collins, CO (US)

(73) Assignee: Broadcom International Pte. Ltd., Singapore (SG)

( * ) Notice: Subject to any disclaimer, the term of this patent is extended or adjusted under 35 U.S.C. 154(b) by 349 days.

(21) Appl. No.: 17/876,488

(22) Filed: Jul. 28, 2022

(65) Prior Publication Data

US 2023/0290703 A1    Sep. 14, 2023

Related U.S. Application Data

(60) Provisional application No. 63/319,092, filed on Mar. 11, 2022.

(51) Int. Cl.
| | | |
|---|---|---|
| H01L 25/18 | (2023.01) | |
| H01L 21/48 | (2006.01) | |
| H01L 23/373 | (2006.01) | |
| H01L 23/498 | (2006.01) | |
| H01L 25/00 | (2006.01) | |

(Continued)

(52) U.S. Cl.
CPC ...... H01L 23/3735 (2013.01); H01L 21/4857 (2013.01); H01L 23/49822 (2013.01); H01L 25/18 (2013.01); H01L 25/50 (2013.01); H05K 1/18 (2013.01); H01L 25/0652 (2013.01); H05K 2201/10159 (2013.01)

(58) Field of Classification Search
CPC ............ H01L 23/3735; H01L 21/4857; H01L 23/49822; H01L 25/18; H01L 25/50; H01L 25/0652; H05K 1/18; H05K 2201/10159

USPC ........................................................ 361/784
See application file for complete search history.

(56) References Cited

U.S. PATENT DOCUMENTS

| | | | |
|---|---|---|---|
| 9,082,633 | B2 | 7/2015 | Grant |
| 9,418,978 | B2 | 8/2016 | Yu et al. |
| 11,152,343 | B1 | 10/2021 | Dokania et al. |

(Continued)

FOREIGN PATENT DOCUMENTS

| | | |
|---|---|---|
| CN | 111987077 A | 11/2020 |
| CN | 113097179 A | 7/2021 |
| WO | WO-2013-004836 A1 | 1/2013 |

OTHER PUBLICATIONS

IEEE, "Design and demonstration of large 2.5D glass interposer for high bandwidth applications," Available Web Site: https://ieeexplore.ieee.org/document/7009629; accessed on Aug. 11, 2022, 3 pages.

(Continued)

*Primary Examiner* — Binh B Tran
(74) *Attorney, Agent, or Firm* — Quarles & Brady LLP (57) ABSTRACT

Copper-connected glass modules on a glass board are provided. An apparatus includes one or more dies, an interposer formed of a first material, the interposer coupled to the one or more silicon dies, the interposer comprising an interconnection layer formed on one side of the interposer, wherein the interconnection layer includes a plurality of copper interconnects, and a substrate comprising a top layer, glass core, and a bottom layer, wherein the interconnection layer of the interposer and the top layer of the substrate are copper bonded.

20 Claims, 5 Drawing Sheets

(51) Int. Cl.
*H05K 1/18* (2006.01)
*H01L 25/065* (2023.01)

(56) References Cited

U.S. PATENT DOCUMENTS

| | | |
|---|---|---|
| 2010/0276794 A1 | 11/2010 | Hughes et al. |
| 2021/0041649 A1* | 2/2021 | Brusberg ........... G02B 6/12004 |
| 2021/0175199 A1 | 6/2021 | Song et al. |
| 2021/0183842 A1 | 6/2021 | Fay et al. |
| 2021/0202463 A1 | 7/2021 | Chen et al. |
| 2021/0265253 A1 | 8/2021 | Bhattacherjee et al. |
| 2022/0037290 A1 | 2/2022 | Yen et al. |
| 2022/0122909 A1* | 4/2022 | Tseng .................. H01L 23/5384 |

OTHER PUBLICATIONS

Stow et al., (2017) Cost-Effective Design of Scalable High-Performance Systems Using Active and Passive Interposers, 8 pages.
Jani (2019) "Test and characterization of high-density 3D interconnects," 100 pages.

* cited by examiner

COPPER CONNECTED GLASS MODULES ON A GLASS BOARD

CROSS-REFERENCE TO RELATED APPLICATIONS

This application claims the benefit of U.S. Provisional Application No. 63/319,092, filed Mar. 11, 2022, entitled COPPER CONNECTED GLASS MODULES ON A GLASS BOARD, the contents of which are hereby incorporated by reference in its entirety.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for a semiconductor package including an interposer and glass substrate.

BACKGROUND

Increasingly, complex systems for artificial intelligence training and other high-performance computing are constructed from arrays of compute nodes, each node being implemented in a system-in-package module typically containing one or more processor dies, respective high-bandwidth memory (HBM) modules, and in some cases input/output (I/O) die driving co-packaged optics or co-packaged copper outputs. As systems continue to scale up, additional compute capability, memory capacity, and compute-to-memory bandwidth, and off-module I/O bandwidth similarly increase, outstripping the capabilities of conventional system-in-package technology.

Thus, methods, systems, and apparatuses for copper connected glass modules on a glass board are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Various embodiments set forth glass modules and an array of copper connected glass modules, and methods of manufacturing glass modules and arrays of copper connected glass modules.

In some embodiments, an apparatus is provided. The apparatus includes one or more dies, an interposer formed of a first material, the interposer coupled to the one or more silicon dies, the interposer including an interconnection layer formed on one side of the interposer, wherein the interconnection layer includes a plurality of copper interconnects, and a substrate including a top layer, glass core, and a bottom layer, wherein the interconnection layer of the interposer and the top layer of the substrate are copper bonded.

In some embodiments, a semiconductor device is provided. The semiconductor device includes a plurality of semiconductor modules and a circuit board. Each semiconductor module respectively includes one or more dies, an interposer formed of a first material, the interposer coupled to the one or more dies, and a substrate. The interposer includes a first interconnection layer formed on one side of the interposer, wherein the first interconnection layer includes a plurality of copper interconnect. The substrate includes a first top layer, a first glass core, and a first bottom layer, wherein the first interconnection layer of the interposer and the top layer of the substrate are copper bonded. The circuit board is coupled to the one or more semiconductor modules, the circuit board including a second top layer, second bottom layer, and a second glass core, wherein the first bottom layer of the substrate and the second top layer of the circuit board are copper bonded.

In in further embodiments, a method of manufacturing copper-connected glass modules is provided. The method includes forming a first interconnection layer on a first side of an interposer, wherein the first interconnection layer includes a first plurality of copper interconnects, wherein the first interconnection layer is configured to couple the interposer to a substrate, and wherein the interposer is formed of a first material, and bonding, via a copper bonding process, the first interconnection layer to a first top layer of the substrate, the substrate including the first top layer, a first glass core, and a first bottom layer. The method continues by forming a second interconnection layer on the first bottom layer of the substrate, wherein the second interconnection layer includes a second plurality of copper interconnects, wherein the second interconnection layer is configured to couple the substrate to a circuit board, and bonding, via the copper bonding process, the second interconnection layer to a second top layer of the circuit board, the circuit board including the second top layer, and a second glass core.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Similarly, when an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Likewise, when an element is referred to herein as being a "layer," it is to be understood that the layer can be a single layer or include multiple layers. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Conventional semiconductor packages for arrayed-module systems rely on solder joints to attach processor die and associated HBMs to packages, both with and without interposers. Conventional assemblies utilize package materials (e.g., substrates and/or circuit boards) formed of organic resins and polymers with significant coefficient of thermal expansion (CTE) mismatch to silicon. Solder provides some compliance, but scaling of systems becomes limited by thermal expansion mismatch. Moreover, due to the low electromigration resistance of common solders, large numbers of connections are used to meet current (electrical current) requirements of a given system, which increases cost and the size of packages. Specifically, package substrates and boards are complicated, often having many routing layers and thick dielectric layers due to the need to route the large number of high-speed signals through the package and out through a printed circuit board (PCB).

By utilizing glass modules to create an array of glass modules on a glass board, CTE-matched materials may be used for active circuitry, interposer and package core, and for the board. Thus, more conductive joints with higher current density capacity may be used to connect the top tier of circuits to the bottom tier, for example through hybrid copper bonding, from the interposer to a glass core module substrate, and from the glass core module substrate to a glass board, for example, through direct copper bonding. The increased current density of the joint allow the dimensions of the modules to be reduced, which further shorten onboard transmission lengths, which further facilitates module-to-module communication via localized interconnects (e.g., over bridge die between modules).

Moreover, because CTE can be matched, a partitioned-overlapped interposer (as described below) may have a large surface area, allowing zero-offset connections to multiple HBM stacks, which in turn allows "active transport" (also described below) in the HBM buffer die to shorten the HBM-to-logic channels, with wider, higher bandwidth-density HBM-to-logic connections. Specifically, in conventional interposers, the interface circuitry on the HBM (e.g., the driver-receiver circuitry communicating with the die) cannot be located directly across from the corresponding interface circuitry on the compute die. The HBM is offset so that some portion of the interconnect between the two interfaces runs at an angle. Such offsets are often utilized as the number and size of HBMs often exceed what can be supported around the perimeter of a die. Thus, the HBMs are placed with an offset, resulting in increased interconnect lengths.

By utilizing CTE matching and a partitioned-overlapped interposer, the die perimeter may effectively be expanded such that all the HBMs can be accommodated without offset. Offsets necessitate a minimum distance between the interface circuitry on the HBM and the interface circuitry on the die, to allow for diagonal routing (typically restricted to 45 degrees). By eliminating all offsets, the interface circuitry on the HBM can be moved from the typical location approximately in the center of the HBM to the edge immediately facing the die—thereby allowing "active transport" on the HBM base die—with zero offset. Specifically, with active transport, the signals of the HBM may be transported from the DRAM interface centrally located under the HBM stack to interface circuitry at the edge of the base die facing the compute die (or interposer in this case), using on-die interconnect with active repeaters as needed. With the interfaces on the interposer and HBM base die aligned at facing edges, the channel length between the interfaces is minimized, allowing the interface to be much more efficient (e.g., higher speed and density, lower power).

Furthermore, because off-module high-speed I/O comes through physically compliant connections (e.g., optical fiber arrays or passive copper cables), through-glass vias (TGVs) in the glass module cores and glass board may be optimized for power delivery. Specifically, by using the back surface of the glass board for voltage down-conversion, power delivery to the board may be accomplished at high voltage over flexible cables, with high current carried only over a short vertical distance.

Figure 1:
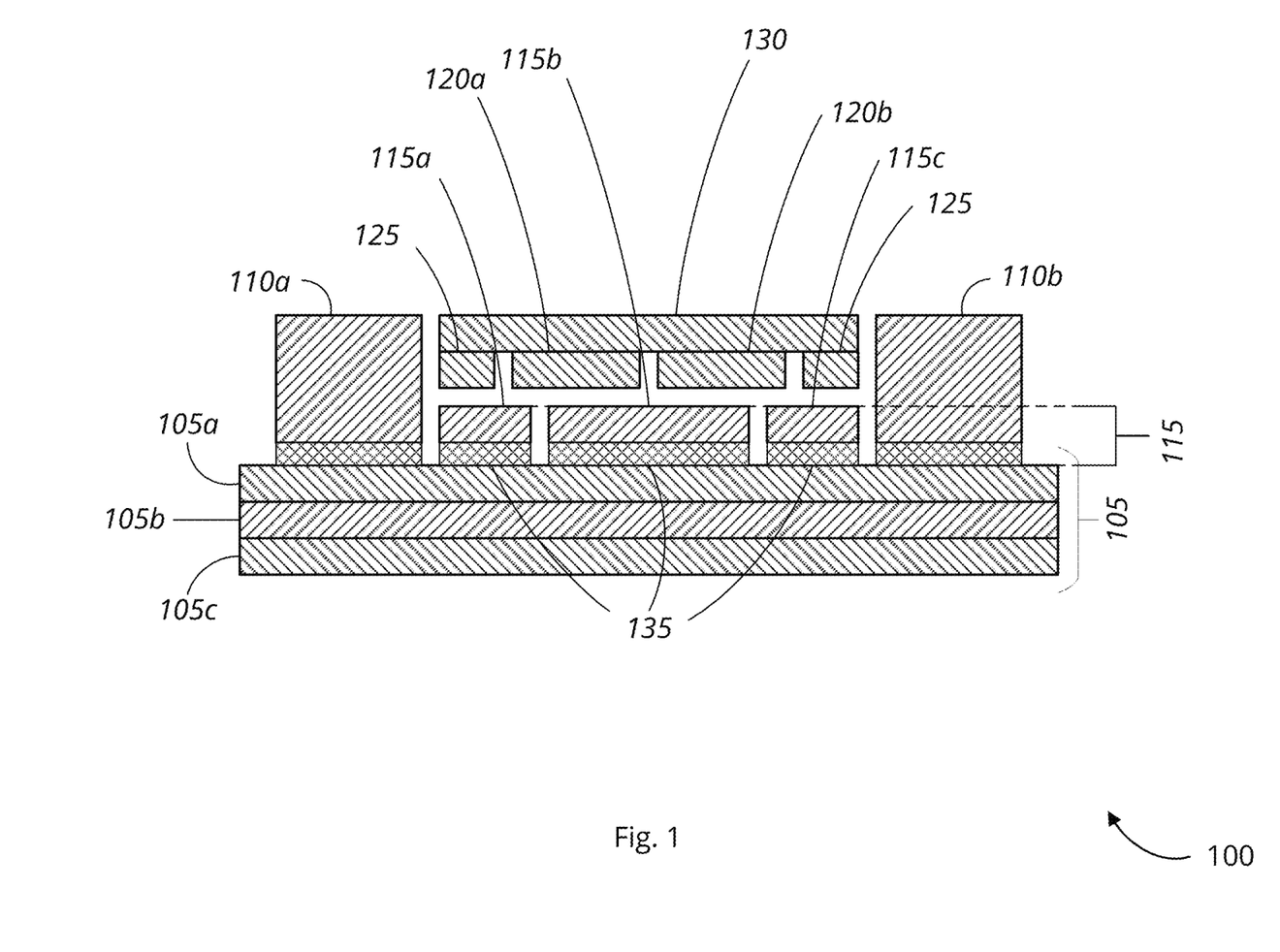
FIG. 1 is a schematic cross-sectional view of a semiconductor module having a glass substrate, in accordance with various embodiments.

FIG. 1 is a schematic diagram of a cross-sectional view of a semiconductor module 100, in accordance with various embodiments. The semiconductor module 100 includes glass substrate 105, one or more HBM dies 110a, 110b, interposer 115, which may include one or more interposer partitions 115a-115c, one or more compute dies 120a, 120b, fill dies 125, and silicon carrier die 130. It should be noted that the various components of the semiconductor module 100 are schematically illustrated in FIG. 1, and that modifications to the various components and other arrangements of semiconductor module 100 may be possible and in accordance with the various embodiments.

In various embodiments, the glass substrate 105 may be a substrate for a semiconductor device including an upper layer 105a, core 105b, and bottom layer 105c. In some examples, the glass substrate 105 may include a core 105b having a CTE that matches the CTE of silicon. In some examples, the core 105b may be glass configured to have a CTE matching the CTE of silicon. In some examples, the glass may be configured to match the CTE of the interposer 115 (e.g., interposer partitions 115a-115c of the interposer 115) and/or the one or more compute dies 120a, 120b. A die, such as the one or more compute dies 120a, 120b, fill dies 125, and silicon carrier die 130, includes a piece of semiconductor material (e.g., silicon or other semiconductor) on which a circuit or set of circuits (e.g., ICs) are fabricated. An interposer (such as interposer 115) includes an electrical interface, formed from silicon or an organic material, that couples the die to other components (including other dies) and/or a substrate (e.g., a package substrate). An interposer may include interconnects, such as through-hole vias, conductive wires, and conductive posts. A substrate (e.g., package substrate), such as glass substrate 105, includes a planar structure (formed from silicon, glass, or other suitable material) on which die and other components (e.g., passive elements) may be mounted (e.g., via the interposer).

In various examples, the interposer 115 may be formed of a material (e.g., silicon and/or organic compounds) on which the copper interconnection layer 135 may be formed. The CTE of the interposer 115 may, thus, refer to the CTE of the material from which the interposer 115 is formed, as opposed to the CTE of the material (e.g., copper) of the copper interconnection layer 135. For example, in some embodiments, the interposer 115 is formed of silicon. In further examples, the interposer 115 is formed of an organic compound. Thus, in some examples, the CTE of the core 105b may be matched to the CTE of silicon, or in other examples, the CTE of the organic material from which the interposer 115 is formed.

In various examples, various techniques may be used to adjust the CTE of the core 105b of the glass substrate 105, such as controlling the process of formation (e.g., crystallization) of the glass, as well as through material selection for forming the glass. Moreover, it is to be understood that the material used for the core 105b of the glass substrate 105 is not limited to any one type of glass (which includes glass-ceramic) material, and may utilize any suitable glass material having a CTE as described.

In some examples, the interposer 115 may include the one or more interposer partitions 115a-115c. Accordingly, the interposer 115 may be a layer of the semiconductor module 100 including an interposer. An interposer, as known to those skilled in the art, includes an electrical and/or physical interface through which connections may be facilitated from the one or more compute dies 120a, 120b and, for example, the glass substrate 105. In some examples, the interposer 115 (e.g., an interposer) may include one or more interconnects to couple, physically and/or electrically, the one or more compute dies 120a, 120b to one or more routing layers of the glass substrate 105. The one or more interconnects of the interposer 115 include, for example, through-silicon vias (TSVs) and/or TGVs, microbumps, copper pads, and/or copper pillars (CuP). Accordingly, in some embodiments, the interconnects of the interposer 115 may be referred to as an "interconnection layer," such as copper interconnection layer 135, which may further include a plurality of copper interconnects, as described above.

Moreover, as used herein, a layer may itself include one or more layers. Thus, the copper interconnection layer 135 includes the one or more layers of the interposer 115, which include respective interconnects (e.g., copper wire or trace, microstrip, copper pads, copper pillars, and through-hole vias (such as TGVs)). Accordingly, in some embodiments, the copper interconnection layer may include one or more redistribution layer (RDL) layers, routing layers, and/or interconnects through which the interposer 115 may be bonded (e.g., copper bonded) to the glass substrate 105.

In further embodiments, the interposer 115 may be divided into one or more interposer partitions 115a-115c corresponding to different die of the semiconductor module 100. For example, in some embodiments, the interposer may be partitioned into a set of dies (e.g., the one or more interposer partitions) that overlap with the top die (e.g., one or more compute dies 120a, 120b, fill dies 125 and/or carrier die 130). Thus, the interposer die sizes may be configured such that no stitching is required between interposer partitions 115a-115c. For example, the interposer partitions 115a-115c may, in some examples, exceed the maximum field size of a stepper used to pattern the interposer features, without shifted exposure to pattern interconnect lines, "stitching" together the patterns across the reticle-field boundaries.

Figure 2:
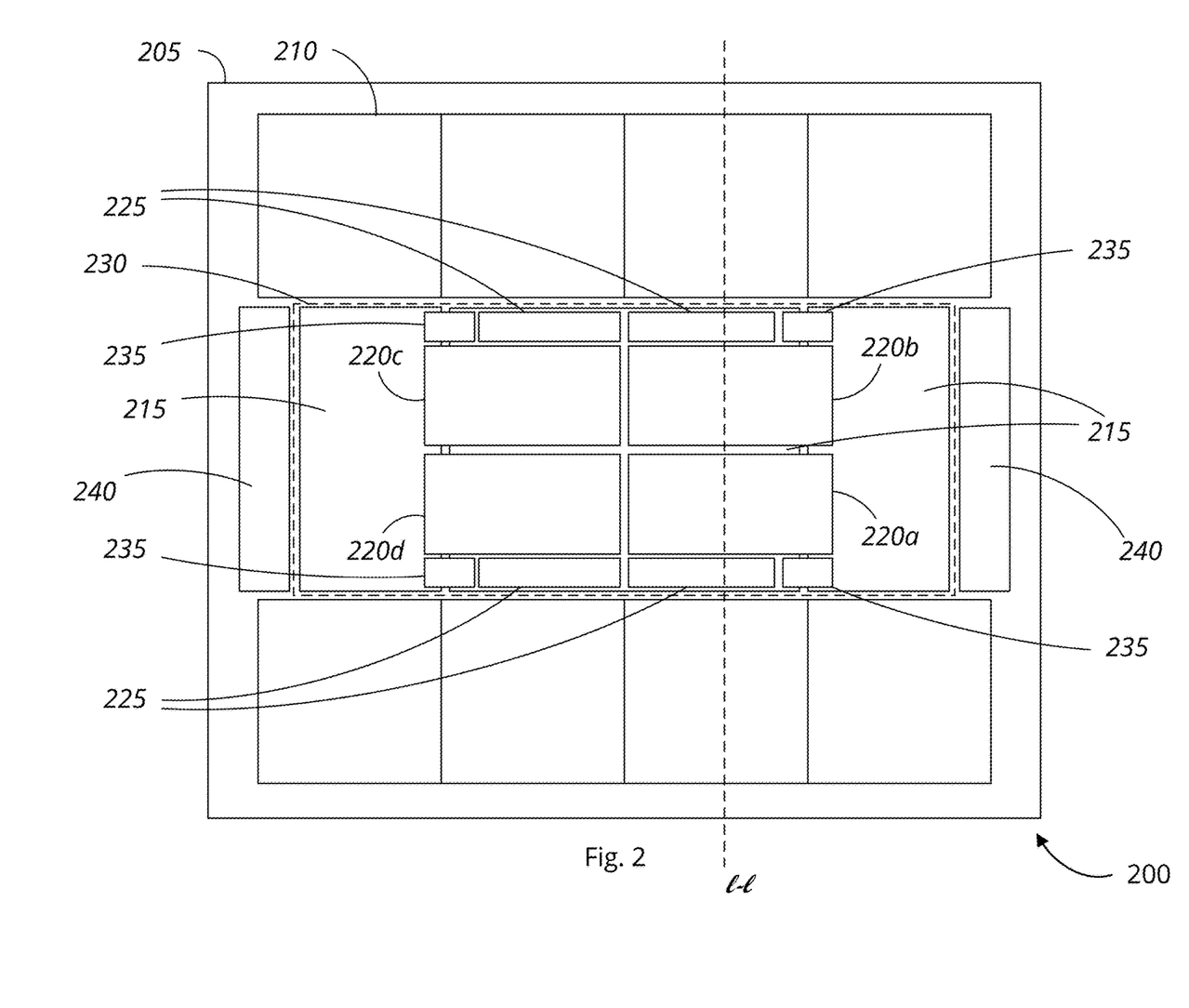
FIG. 2 is a schematic top view of an array of semiconductor modules on a glass board, in accordance with various embodiments.

In some examples, communication between different interposer partitions 115a-115c may be implemented via a passive bridge die, as shown in FIG. 2. Thus, in some examples, the one or more interposer partitions 115a-115c may be configured to communicate vertically with the one or more compute dies 120a, 120b in overlapping areas. Thus, in some embodiments, a given interposer partition of the one or more interposer partitions 115a-115c may be, at least partially, overlapped by at least one of the top dies (e.g., one or more compute dies 120a, 120b, fill dies 125, and/or carrier die 130). In some further examples, multiple top dies may overlap an individual interposer partition of the one or more interposer partitions 115a-115c. In yet further examples, an individual interposer partition of the one or more interposer partitions 115a-115c may be completely overlapped by a top die.

In yet further examples, because CTE is matched between the substrate 105 and interposer 115, a single, monolithic interposer (not shown) may be utilized, the interposer overlapping the one or more compute dies 120a, 120b. In some further examples, the interposer 115 may be coupled to the substrate 105 via copper bonding. For example, in some embodiments, each of the interposers (e.g., one or more interposer partitions 115a-115c and/or a single interposer) of the interposer 115 may be copper bonded (e.g., coupled by copper bonding) to a top layer 105a of the substrate 105. In various examples, copper bonding includes bonding through a copper bonding process. For example, copper bonding processes may include, without limitation, hybrid copper bonding (HCB) and/or direct copper bonding (DCB). Accordingly, in some examples, the interposer 115 may include a copper interconnection layer 135, which may be copper bonded to the copper of a top layer 105a of the glass substrate 105. Thus, the glass substrate 105 may, in some examples, include a respective copper routing layer 105a on a top layer of the glass substrate. The copper routing layer of the top layer 105a may include various interconnects, such as copper wire, copper trace, microstrip, copper pads, and through-hole vias (such as TGVs), among other suitable interconnects. Thus in some examples, copper routing layer of the glass substrate 105 may be configured to provide electric and/or physical connectivity to other die coupled to the glass substrate 105 and/or vertical connectivity to a bottom layer 105c of the glass substrate 105 (e.g., through TGVs) for further coupling to other semiconductor packages 100, or a circuit board (e.g., PCB) or other substrate. In yet further examples, the bottom layer 105c may itself include a copper routing layer, similar to that of the top layer 105a. The copper routing layer of the bottom layer 105c may include interconnects, such as microbumps, wires, pads, copper pillars, TGVs, etc., configured to allow the substrate 105 to be coupled, for example, to a circuit board or other substrate. In some examples, the copper routing layers of the substrate 105 include one or more layers of RDL.

The semiconductor module 100 may further include HBMs 110a, 110b, which may be coupled to the substrate 105, and further to the one or more compute dies 120a, 120b for example, via HBM PHY dies (e.g., physical layer interface dies), I/O dies, and/or through the interposer 115 (e.g., via one or more interposer partitions 115a-115c). Fill dies 125 may be provided to fill gaps between the logic dies 120a, 120b and respective HBMs 110a, 110b. In some examples, a silicon carrier die 130 may be provided overlapping the one or more logic dies 120a, 120b, and configured to provide additional rigidity to the semiconductor module 100.

FIG. 2 is a schematic diagram of a top view of a semiconductor module 200, in accordance with various embodiments. The semiconductor module 200 includes glass substrate 205, one or more HBM dies 210, interposer(s) 215, which may include one or more interposer partitions (e.g., interposer partitions 115a-115c of FIG. 1), one or more compute dies 220a-220d, fill dies 225, silicon carrier die 230, bridge dies 235, and I/O dies 240. It should be noted that the various components of the semiconductor module 200 are schematically illustrated in FIG. 2, and that modifications to the various components and other arrangements of semiconductor module 200 may be possible and in accordance with the various embodiments.

As previously described with respect to FIG. 1, the semiconductor module 200 may include several dies coupled to a substrate 205 via an interposer 215. The interposer 215 may include one or more interposer partitions, which may further be coupled to the substrate 205 via copper bonding (e.g., HCB and/or DCB). In the top view, the one or more compute dies 220a-220d are shown, along with bridge dies 235, and I/O dies 240. FIG. 1, accordingly, may be a cross-section taken along line 1-1, such that a sectional view of the HBMs 210, fill dies 225, compute dies 220a, 220b, interposer 215, and substrate 205 are shown. As previously described, any areas of the interposers and/or interposer partitions of the interposer 215 not otherwise covered by active and/or passive top die may be covered by respective fill die 225.

In various embodiments, because the CTE of the substrate 205 is matched to the CTE of the interposers of the interposer 215, a larger interposer die size may be utilized. Specifically, a larger interposer (e.g., of interposer 215) allows for greater computational area, and a larger perimeter with which the interposer may couple to HBMs 210 and I/O dies 240, enabling module-to-module communications and off-board communications through co-packaged optics and/or co-packaged copper cables. Accordingly, I/O dies 240 include dedicated dies configured to handle off-die (also referred to as "off-chip") communications (e.g., communications to or from a given die/IC). This includes die-to-die communications that are on-board (e.g., between the one or more compute dies 220a-220d), and further includes off-board communications (e.g., from a die of the semiconductor module 200 to another component that is off-board and/or part of a different module). Accordingly, in some examples, I/O dies 240 may respectively include one or more communication circuits configured to facilitate the off-die communications. Facilitating communication off-die may include, for example, managing, processing, routing, and/or carrying various data signals between on-board dies and/or off-board.

In various examples, bridge dies 235 (also referred to interchangeably as a "bridging die") is a die configured to serve as a silicon bridge between, in this example, two or more interposer partitions of the interposer 215. The bridge die 235 may, accordingly, include various interconnects (e.g., conductive wires, through-hole vias, and/or pads) electrically coupling at least two interposer partitions, allowing data signals to be carried between the at least two interposer partitions coupled via the bridge die(s) 235.

In some further embodiments, HBMs 210 may be located off-module, and may be coupled to the semiconductor module 200, for example, via co-packaged optical connections. In some embodiments, a zero-offset connection to many HBMs 210 may be possible, which in turn may allow active transport in the HBM dies to shorten the HBM-to-logic channels, with wider, higher bandwidth-density HBM-to-logic connections.

Figure 3:
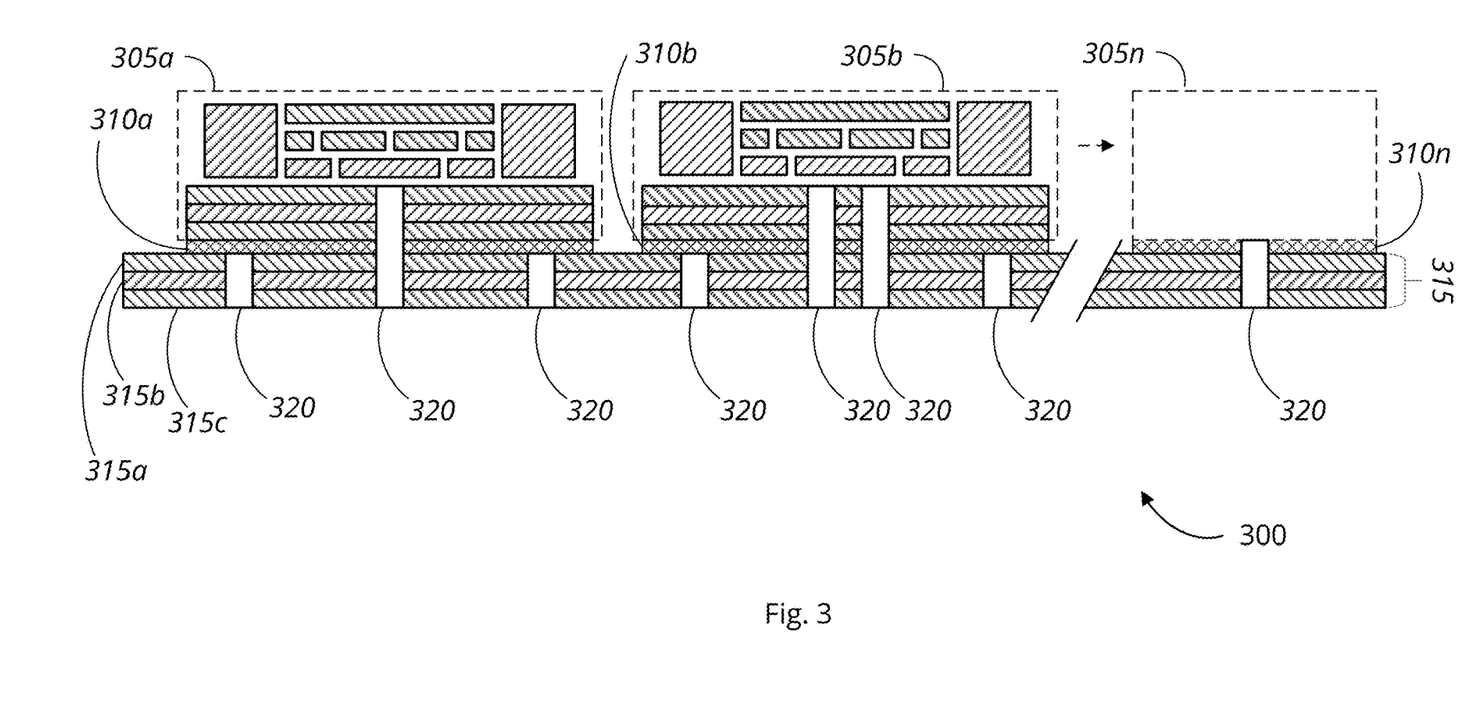
FIG. 3 is a schematic cross-sectional view of an array of copper connected semiconductor modules on a glass board, in accordance with various embodiments.
Figure 4:
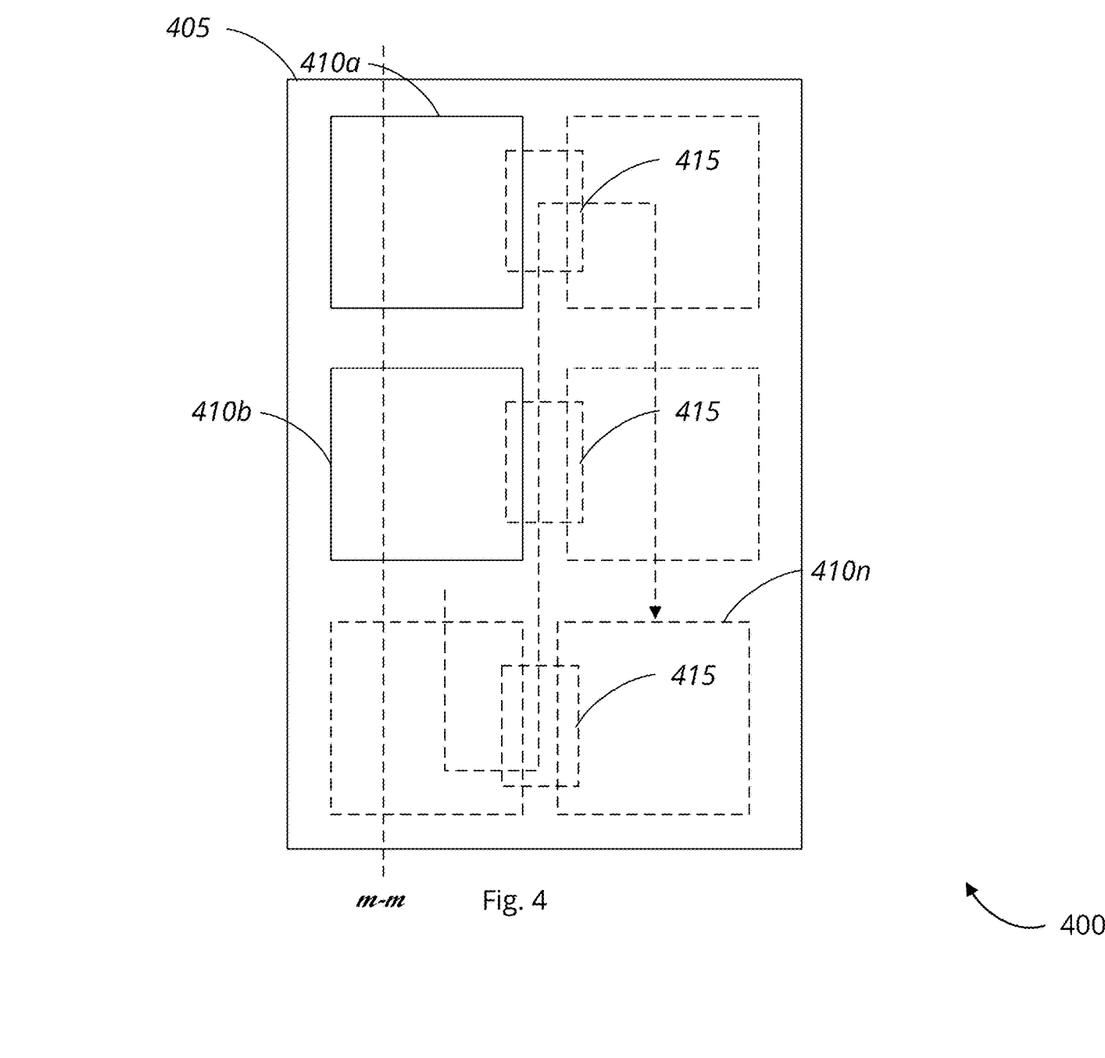
FIG. 4 is a schematic top view of an array of copper connected semiconductor modules on a glass board, in accordance with various embodiments.

FIGS. 3 & 4 illustrate an example of such an array of semiconductor modules.

FIG. 3 is a schematic cross-sectional view of an array 300 of copper connected semiconductor modules on a glass board, in accordance with various embodiments. The array 300 includes one or more semiconductor modules 305a-305n, copper interconnection layer 310, circuit board 315, and a plurality of through-glass vias (TGVs) 320. It should be noted that arrangement of the array 300 is schematically illustrated in FIG. 3, and that modifications to arrangement of the array 300 and semiconductor modules 305a-305n may be possible and in accordance with the various embodiments.

In various embodiments, the array 300 may include one or more semiconductor modules 305a-305n as described with respect to FIGS. 1 & 2. Specifically, semiconductor modules 305a-305n may include one or more interposers coupled, via copper bonding, to a semiconductor substrate having a glass core. Like semiconductor substrate of the one or more semiconductor modules 305a-305n, the circuit board 315 may, in various examples, include a top layer 315a, board core 315b, and bottom layer 315c. The circuit board 315 may further be configured to have a CTE matching the CTE of silicon. Accordingly, in some examples, the circuit board 315 may be a glass board, and the board core 315b may be a glass core. The glass may, in some examples, be engineered glass configured to have a CTE matching the CTE of, for example, the one or more interposers of the interposer of the one or more semiconductor modules 305a-305n, and/or one or more compute dies of the one or more semiconductor modules 305a-305n.

As known to those skilled in the art, a CTE of a material is a characteristic that varies over temperature. Although a material having a certain CTE value may be created and the CTE values adjusted, the CTE of the material is inexact to the extent that manufacturing tolerances are inexact and introduce variation in CTEs. Thus, in various examples, matching CTEs may include CTEs that are within a range of CTEs of a given material. For example, in some embodiments, CTEs may be considered "matched" when within a range of CTEs of a given material. For example, the CTE of pure silicon (Si) ranges between 2.6-3.3 parts per million per degree Celsius (e.g., 2.6-3.3 ppm/° C.). Accordingly, a material may be considered to have a matched CTE to Si if the CTE of the material is in the range of 2.6-3.3 ppm/° C. Similarly, a material may be considered to have the CTE of a target material if it is within the range of CTEs of the target material. For example, a material may be considered to have a CTE of Si if the material has a CTE in the range of 2.6-3.3 ppm/° C. In other examples, CTEs may be considered to be matched when within a threshold range of each other. In some examples, CTEs may be considered matched if within a range of 10% of the CTE of the material with a higher CTE at the same temperature. For example, if at a given temperature, a first material has a CTE of 3 ppm/° C., a second material may be considered have a matched CTE to the first material if the CTE of the second material is within a range of 2.7-3.3 ppm/° C. at the given temperature. Accordingly, as used herein, the terms "match," "matching," and "matched," and other similar terms are not restricted to exact matches of exact CTE values, and are inclusive of materials considered to have "matched CTEs" by those skilled in the art and as used in the field of material engineering, as having respective CTE values that are close to the extent possible with current (and/or later developed) material engineering processes.

In various examples, off-board I/O signals may come through physically compliant connections to co-packaged I/O, such as flexible fiber optic and/or copper cabling. Accordingly, in some examples, routing on the circuit board 315 may be implemented via a single copper routing layer on the front (e.g., top layer 315a) and back (e.g., bottom layer 315c) layers.

In further examples, with both the board core 315b of the circuit board 315 and substrate core (e.g., substrate core 105b of FIG. 1) of the one or more semiconductor modules being CTE-matched glass, the one or more semiconductor modules 305a-305n, and specifically the substrate of the respective semiconductor modules 305a-305n, may be coupled to the circuit board 315a via copper bonding, such as HCB and/or DCB. In some examples, copper bonding may include, without limitation, thermo-compression copper bonding, and/or nano-particulate copper bonding. In some further examples, soldering (e.g., solder ball grid arrays (BGAs), etc.) may be used, alone, or in combination with copper bonding. Thus, in various embodiments, the array 300 may include a copper interconnection layer 310a-310n that is copper bonded between a bottom layer of the semiconductor substrate and a top layer of the circuit board 315.

In various embodiments, the circuit board 315 may further include one or more TGVs 320. Because off-module high-speed I/O can be carried through physically compliant connections (e.g., fiber optic and/or copper cabling), the TGVs 320 through both the glass core of the semiconductor substrate and circuit board 315 may be optimized for power delivery. This is in contrast with some conventional packages in which through-hole vias are designed based on electrical characteristics of I/O signals, and signal quality in mind.

FIG. 4 is a schematic top view of an array 400 of copper connected semiconductor modules on a glass board, in accordance with various embodiments. The array 400 may include circuit board 405, one or more semiconductor modules 410a-410n, and bridging die(s) 415. It should be noted that the components of the array 400 are schematically illustrated in FIG. 4, and that modifications to arrangement of semiconductor modules 410a-410n and other components may be possible and in accordance with the various embodiments.

In some embodiments, the one or more semiconductor modules 405a-405n may be arranged in two rows (or columns depending on orientation). FIG. 3, accordingly, may be a cross-section taken along line m-m, such that a sectional view of a single row of semiconductor modules 410a-410n is shown. In various embodiments, the interior-facing edges of each row of respective semiconductor modules 410a-410n may be configured to transmit serialized electrical output. Specifically, in some examples, serializer-deserializer (SerDes) I/O dies may be arranged along at least one interior-facing edge of each respective semiconductor module. Similarly, a co-packaged optical or passive copper I/O die may be arranged along at least one exterior-facing edge of each respective semiconductor module. In yet further embodiments, interior electrical connections between the modules may be routed across interconnection bridging die(s) 415, which may be placed between semiconductor modules across rows.

Figure 5:
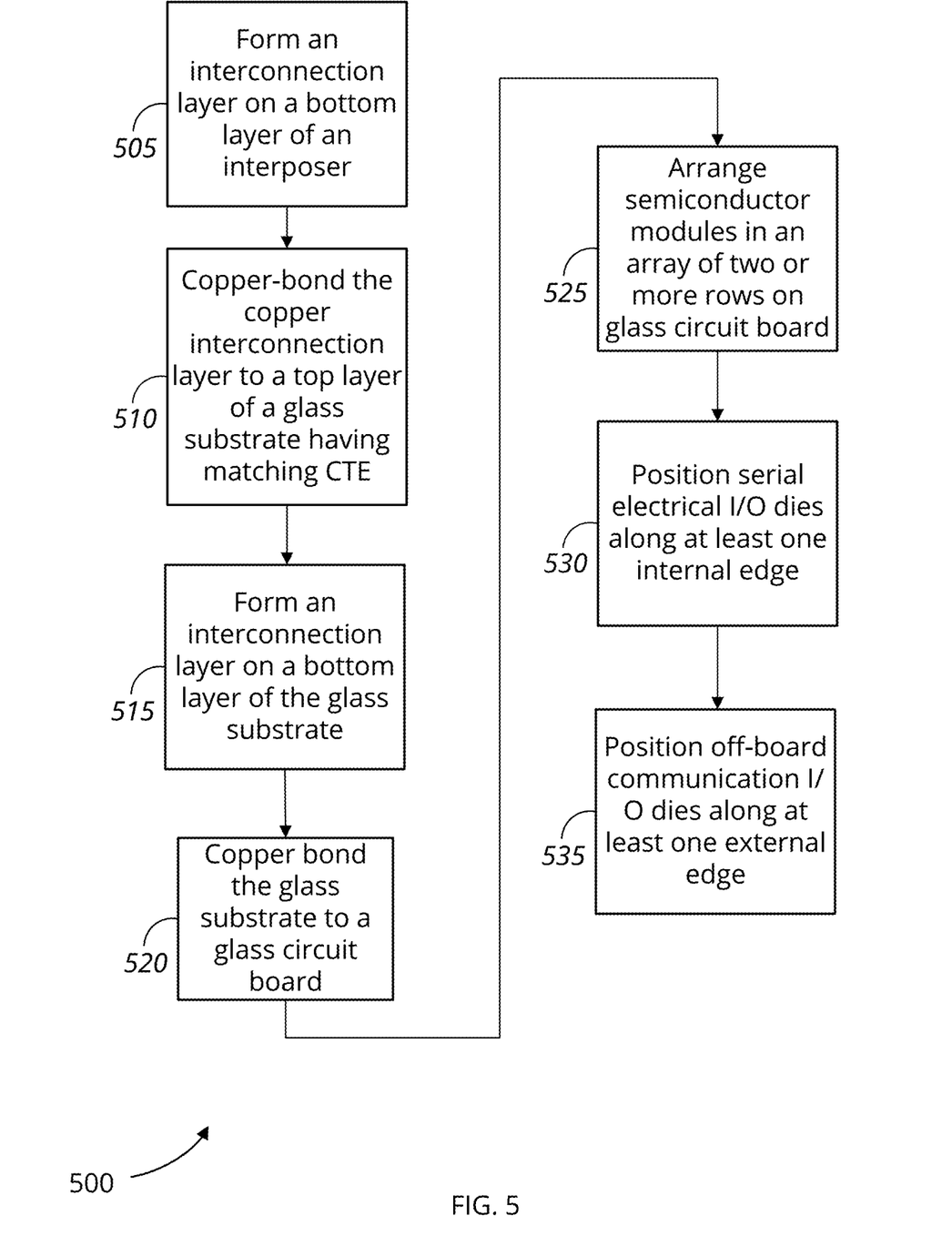
FIG. 5 is a flow diagram of a method of manufacturing an array of copper connected semiconductor modules, in accordance with various embodiments.

FIG. 5 is a flow diagram of a method 500 of manufacturing an array of copper connected semiconductor modules, in accordance with various embodiments. The method 500 may begin, at block 505, by forming an interconnection layer on a bottom layer of an interposer of a semiconductor module. As previously described, in various embodiments, an interposer may be coupled to a glass substrate. The glass substrate may be configured to have a CTE matching the CTE of silicon, and in this case, the interposer. Thus, the interposer may include an interconnection layer through which the interposer may be coupled to the glass substrate via copper bonding. Accordingly, in some examples, the interconnection layer may be a copper interconnection layer, in which copper interconnects (e.g., copper wire, traces, micro strip, pads, and/or TGVs with a copper metallization layer) may be formed on the bottom layer of the interposer. In various embodiments, forming the copper interconnection layer may include copper plating and/or depositing of copper film to form the respective interconnects of the interconnection layer.

The method 500 may continue, at block 510, by copper bonding the interconnection layer of the interposer to the glass substrate. In some examples, the copper bonding interconnection layer may be copper bonded to the top layer of the glass substrate. Thus, the glass substrate may, in some examples, include a respective copper interconnection layer on a top layer of the glass substrate. In yet further embodiments, the top layer of the glass substrate may include a copper routing layer. In various examples, copper bonding may include, without limitation, HCB, DCB, or both. In some examples, connections between the interposer and the glass substrate may further include solder connections, alone or in combination with the copper bonded connections. In some examples, the glass core of the substrate may be formed having a CTE matching the CTE of silicon. As previously described, in some examples, the glass core may be engineered to have a CTE of silicon. The substrate may include one or more layers of glass. In yet further examples, the top layer of the substrate may be the top surface of the glass core on which a respective copper routing layer and/or other copper interconnects may be formed (e.g., via a copper plating or copper film deposition process). Thus, in some further examples, the method may include forming a respective interconnection layer (e.g., a copper routing layer) on a top layer (and/or top surface) of the glass substrate. In some examples, the interconnection layer may include one or more layers of a RDL.

The method 500 continues, at block 515, by forming an interconnection layer on a bottom layer of the glass substrate. In various embodiments, like the interposer, the glass substrate may further be coupled to a glass circuit board. The glass circuit board may similarly be CTE-matched to silicon. In some examples, the CTE of the glass circuit board may be matched to the CTE of the interposer and/or one or more compute dies of the semiconductor package. As previously described, various techniques, including techniques known to those skilled in the art, may be used to adjust the CTE of the glass substrate, interposer, and/or glass circuit board, such as controlling the process of formation (e.g., crystallization) of the glass, as well as through material selection for forming the glass. In yet further examples, matching CTEs of a glass substrate, glass circuit board, and/or interposer may include selecting a glass substrate, glass circuit board, and/or interposer, formed of a material having the same CTE.

Thus, the glass substrate may further be configured to include an interconnection layer through which the glass substrate may similarly be copper bonded, in this case to the glass circuit board (or other glass substrate). Accordingly, in some examples, the interconnection layer may be a copper interconnection layer (as opposed to a conventional solder BGA), which may be formed on the bottom layer of the glass substrate. As previously described, in some examples, the interconnection layer may include copper interconnects formed (e.g., via a copper plating or copper film deposition process) on the bottom surface. Copper interconnects at the bottom layer of the glass substrate may include, without limitation, copper bumps (e.g., microbumps), TGVs, copper posts, copper pads, copper wires and/or traces. In some examples, the interconnection layer may be referred to as a copper routing layer. In further examples, the interconnection layer includes one or more layers of a RDL.

At block 520, the method 500 may continue by copper bonding the glass substrate to the glass circuit board. As previously described, in various examples, copper bonding may include, without limitation, HCB, DCB, or both. In some examples, connections between the glass substrate and the glass circuit board may further include solder connections, alone or in combination with the copper bonded connections.

The method 500 continues, at block 525, by arranging two or more semiconductor modules in an array of two or more rows on the glass circuit board. As previously described, an array of semiconductor modules having glass semiconductor substrates may be formed on a glass circuit board. Accordingly, in some examples, each of the semiconductor modules may be copper bonded to the glass circuit board. At block 530, the method further includes positioning serial electrical output I/O dies along an interior-facing edge of the respective semiconductor modules. In various embodiments, the interior-facing edges of each row of respective semiconductor modules may be configured to for serialized electrical output. For example, respective SerDes I/O dies may be arranged along at least one interior-facing edge of each respective semiconductor module. In yet further embodiments, interior electrical connections between the modules may be routed across interconnection bridging die(s), which may be placed between semiconductor modules across rows, between the interior-facing edges of respective pairs of semiconductor modules. The method 500 further includes, at block 535, positioning off-board communication I/O dies along at least one exterior-facing edge of the semiconductor modules. As previously described, a co-packaged optical or passive copper I/O die may be arranged along at least one exterior-facing edge of each respective semiconductor modules to carry off-board communications, which may be carried over the physically compliant connection media (e.g., optical fiber and/or copper cabling).

The techniques and processes described above with respect to various embodiments may be used to manufacture the semiconductor module 100, 200 and/or array 300, 400 of semiconductor modules and/or components thereof, as described herein.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. An apparatus comprising:
   one or more dies;
   an interposer formed of a first material, the interposer coupled to the one or more dies, the interposer comprising an interconnection layer formed on one side of the interposer, wherein the interconnection layer includes a plurality of copper interconnects; and
a substrate comprising a top layer, glass core, and a bottom layer, wherein the interconnection layer of the interposer and the top layer of the substrate are copper bonded.

2. The apparatus of claim 1, wherein the glass core and the first material of the interposer respectively have matched coefficients of thermal expansion.

3. The apparatus of claim 2, wherein the glass core has a coefficient of thermal expansion of silicon.

4. The apparatus of claim 1, wherein the top layer of the substrate includes a copper routing layer.

5. The apparatus of claim 1, wherein the bottom layer of the substrate includes a copper routing layer.

6. The apparatus of claim 1, wherein the interposer comprises one or more interposer partitions, each interposer partition at least partially overlapped by at least one of the one or more dies.

7. The apparatus of claim 6, further comprising:
one or more bridging dies, wherein each bridging die of the one or more bridging dies is coupled to at least two interposer partitions.

8. The apparatus of claim 1, wherein the one or more dies includes:
one or more first I/O dies configured to facilitate on-board communications; and
one or more second I/O dies coupled to at least one of co-packaged optics or copper cable, the at least one of co-packaged optics or copper cable configured to carry off-board communication.

9. A semiconductor device comprising:
a plurality of semiconductor modules, each semiconductor module respectively comprising:
one or more dies;
an interposer formed of a first material, the interposer coupled to the one or more dies, the interposer comprising a first interconnection layer formed on one side of the interposer, wherein the first interconnection layer includes a plurality of copper interconnects; and
a substrate comprising a first top layer, a first glass core, and a first bottom layer, wherein the first interconnection layer of the interposer and the top layer of the substrate are copper bonded;
a circuit board coupled to the one or more semiconductor modules, the circuit board comprising a second top layer, second bottom layer, and a second glass core, wherein the first bottom layer of the substrate and the second top layer of the circuit board are copper bonded.

10. The semiconductor device of claim 9, wherein each of the respective first glass cores, the first material of the interposers, and second glass core have matched coefficients of thermal expansion.

11. The semiconductor device of claim 10, wherein the coefficient of thermal expansion of the second glass core has a coefficient of thermal expansion of silicon.

12. The semiconductor device of claim 9, wherein the plurality of semiconductor modules are arranged in two rows of semiconductor modules.

13. The semiconductor device of claim 12, wherein the one or more dies includes:
one or more first I/O dies configured to facilitate on-board communications, and positioned at at least one interior-facing edge of the respective row of the respective semiconductor module; and
one or more second I/O dies coupled to at least one of co-packaged optics or copper cable, the at least one of co-package optics or copper cable configured to carry off-board communication, the one or more second I/O dies positioned at at least one exterior-facing edge of the respective row of the respective semiconductor module.

14. The semiconductor device of claim 9, wherein each of the respective interposers comprises one or more interposer partitions, each interposer partition at least partially overlapped by at least one of the one or more dies.

15. A method comprising:
forming a first interconnection layer on a first side of an interposer, wherein the first interconnection layer includes a first plurality of copper interconnects, wherein the first interconnection layer is configured to couple the interposer to a substrate, and wherein the interposer is formed of a first material;
bonding, via a copper bonding process, the first interconnection layer to a first top layer of the substrate, the substrate comprising the first top layer, a first glass core, and a first bottom layer;
forming a second interconnection layer on the first bottom layer of the substrate, wherein the second interconnection layer includes a second plurality of copper interconnects, wherein the second interconnection layer is configured to couple the substrate to a circuit board; and
bonding, via the copper bonding process, the second interconnection layer to a second top layer of the circuit board, the circuit board comprising the second top layer, and a second glass core.

16. The method of claim 15, further comprising:
forming the first glass core and the second glass core to have a coefficient of thermal expansion equal to a coefficient of thermal expansion of the first material of the interposer.

17. The method of claim 15, wherein the interposer comprises one or more interposer partitions, wherein copper bonding the first interconnection layer to the first top layer of the substrate comprises copper bonding each of the one or more interposer partitions to the substrate.

18. The method of claim 15, further comprising:
arranging a plurality of semiconductor modules into an array of two or more rows of semiconductor modules on the circuit board, wherein each semiconductor module comprises a respective substrate having a respective second interconnection layer, wherein each semiconductor module is copper bonded to the circuit board via respective second interconnection layer.

19. The method of claim 18, wherein each semiconductor module respectively comprises one or more dies coupled to a respective interposer, wherein each of the respective one or more dies includes one or more I/O dies configured to facilitate on-board communications, wherein arranging the plurality of semiconductor modules further comprises positioning the one or more I/O dies configured to manage on-board communications at at least one interior-facing edge of the respective row of the respective semiconductor module.

20. The method of claim 18, wherein each semiconductor module respectively comprises one or more dies coupled to a respective interposer, wherein each of the respective one or more dies includes one or more I/O dies coupled to at least one of co-packaged optics or copper cable, the at least one of co-packaged optics or copper cable configured to carry off-board communication, wherein arranging the plurality of semiconductor modules further comprises positioning the one or more I/O dies coupled to the at least one of co-packaged optics or copper cable at at least one exterior-facing edge of the respective row of the respective semiconductor module.

* * * * *